INVENTORS
JULIAN R. A. BEALE
ANDREW F. BEER
PETER C. NEWMAN
BY Frank R. Trifari
AGENT INVENTORS
JULIAN R. A. BEALE
ANDREW F. BEER
PETER C. NEWMAN
BY Frank R. Trifari
AGENT United States Patent Office 3,416,047

Patented Dec. 10, 1968

3,416,047

OPTO-PN JUNCTION SEMICONDUCTOR HAVING GREATER RECOMBINATION IN P-TYPE REGION

Julian Robert Anthony Beale, Reigate, and Andrew Francis Beer and Peter Colin Newman, Crawley, England, assignors to North American Philips Company, Inc., New York, N.Y., a corporation of Delaware Filed Jan. 20, 1966, Ser. No. 521,842
Claims priority, application Great Britain, Jan. 21, 1965, 2,693/65
15 Claims. (Cl. 317—234)

ABSTRACT OF THE DISCLOSURE

A monocrystalline semiconductor radiation body has a substrate comprising an epitaxial deposited surface layer. The body has a p-n junction formed within the surface layer between n-type material on the substrate side and p-type material on the side adjacent the surface. The concentration of donors in the n-type material is greater than the concentration of acceptors in the p-type material, resulting in a proportionately greater injection of charge carriers, upon application of forward bias, from the n-type material into the p-type material for producing a larger proportion of recombination of carriers in the p-type material.

The invention relates to a semi-conductor device comprising a semi-conductor body having a p-n junction which, when suitably biased in the forward direction, produces radiation as a result of recombination of the injected charge carriers and further relates to a method of manufacturing such a device.

P-n transition recombination radiation sources are known per se in which, for example, it is possible to form light emitting diodes consisting of gallium arsenide, gallium phosphide, gallium antimonide, indium arsenide, indium antimonide, gallium arseno-phosphide, indium gallium arsenide, and silicon carbide.

Further it is possible to form a gallium arsenide optically coupled transistor using a light emitting junction in a p-n-p or n-p-n structure, in which a first p-n junction is capable of emitting photons when suitably biased in the forward direction, while a second photosensitive p-n junction can transform the energy of photons emanating from the first p-n junction to that of charge carriers when the second p-n junction is suitably biased in the reverse direction.

In an article entitled "Coherent Light Emission From GaAs Junctions" by R. N. Hall c.s. in Physical Review Letters, volume 9, No. 9, pages 366–368, Nov. 1, 1962, it is reported that coherent infrared radiation has been observed from forward biased gallium arsenide p-n junctions. In an article entitled: "Stimulated Emission of Radiation From Gallium Arsenide P-N Junctions" by M. I. Nathan c.s. in Applied Physics Letters, volume 1, No. 3, Nov. 1, 1962, pages 63/64, the observation of the narrowing of an emission line from a forward biased gallium arsenide p-n junction was reported and it was postulated that this narrowing was direct evidence of the occurrence of stimulated emission. These findings were confirmed in an article entitled "Semiconductor Maser of Gallium Arsenide" by T. M. Quist et al. in Applied Physics Letters, volume 1, No. 4, Dec. 1, 1962, where it was stated that coherent radiation had been obtained from gallium arsenide diodes at 77° K. Laser action is also obtainable with forward biased p-n junctions in other III–V semiconductor compounds, for example, indium phosphide, indium arsenide, indium antimonide and aluminium arsenide, or in substituted III–V semiconductor compounds, for example, gallium arseno-phosphide ($GaAs_{1-x}P_x$) and indium gallium arsenide ($In_{1-x}Ga_xAs$).

A III–V semiconductor compound is to be understood to mean herein a compound of substantially equal atomic quantities of an element of the class consisting of boron, aluminumo, gallium and indium of group III of the periodic system and an element of the class consisting of nitrogen, phosphorus, arsenic and antimony of group V of the periodic system. A substituted III–V semiconductor compound is to be understood to mean a III–V semiconductor compound in which a few of the atoms of the element of the said class of group III are replaced by atoms of another element or other elements of the same class and/or a few atoms of the element of the above class of group V are replaced by atoms of another element or other elements of the same class.

In the manufacture of light emitting diodes, opto-electronic transistors and lasers in which the emitting p-n junction is in gallium arsenide it is common practice to form the p-n junction by the diffusion of an acceptor element, such as zinc, into an n-type body or body part uniformly doped with a donor element such as tellurium. It is further known to form light-emitting p-n junctions by an alloying process. In an article entitled, "Light Emission and Electrical Characteristics of Epitaxial Gallium Arsenide Laser and Tunnel Diodes," by N. N. Winogradov and H. K. Kessler in "Solid State Communications" volume 2, 1964, pages 119/122, laser characteristics of epitaxially formed gallium arsenide p-n junctions are compared with those of zinc diffused lasers. It is postulated that since the diffusion process generally produces graded junctions, the abruptness and uniformity of a junction produced by the epitaxial deposition of an n-type conductive layer of gallium arsenide on a (100) face of p-type conductive gallium arsenide substrate would produce efficient low threshold lasers. It was found that enhanced laser action occurred when a high concentration of donors was deliberately added to the p-type conductive side, diodes obtained from an epitaxial wafer made by depositing an $n^+$ layer doped with tellurium in a concentration of $1\times10^{19}$ atoms/cm.$^3$ onto a double doped p-type conductive substrate containing the acceptor zinc in a concentration of $5.2\times10^{19}$ atoms/cm.$^3$ and the donor tellurium in a concentration of $2.6\times10^{19}$ atoms/cm.$^3$ yielding intense light output.

The invention is based on the recognition that it is desirable to have as much as possible of the recombination taking place in the p-type region side of the junction as this yields narrow frequency band radiation having an energy value only slightly less than the energy gap of the semiconductor material whereas recombination which takes place in the n-type region side of the junction in addition yields broad band radiation having an energy value considerably less than the energy gap of the semiconductor material and varying in wavelength and intensity from one device to another analogously manufactured device. To achieve a large proportion of the recombination taking place in the p-type region side of the junction greater injection of electrons into the p-type region than injection of holes into the n-type region must occur. Therefore it is desirable to have a higher concentration of donors in the n-type region side of the junction than the concentration of acceptors in the p-type region side of the junction. In the previously referred to devices formed by diffusion of an acceptor element into an n-type body part the concentration of donors in the n-type region side of the junction is lower than the concentration of acceptors in the p-type region side of the junction.

The invention is further based on the recognition that in some semiconductor materials an acceptor element may have a considerably higher diffusion coefficient in a material in which there is a significant concentration of holes, such as the higher resistivity epitaxially deposited material of the second region than in a material in which there is a lower hole concentration, such as the lower resistivity n-type material of the first region. Thus the diffusion may be effected, provided the diffused acceptor concentration obtained is lower than the donor concentration in the low resistivity n-type material, such that the p-n junction is located in the transition region between the lower resistivity n-type material and the higher resistivity epitaxially deposited material and a relatively uniform acceptor concentration is obtained in the higher resistivity material. This has the advantage that in a device according to the invention by diffusion of an acceptor in the higher resistivity epitaxially deposited material the p-n junction can be conveniently arranged to lie in the vicinity of the transition region between the lower resistivity n-type material and the higher resistivity epitaxially deposited material to yield the desired excess concentration of donors in the n-type region side over the concentration of acceptors in the p-type side.

Consequently, a semiconductor device comprising a semiconductor body having a p-n junction which, when suitably biased in the forward direction, produces radiation as a result of the recombination of the injected charge carriers is characterized according to the invention in that the p-n junction is situated between a first, lower resistivity n-type region and a second, p-type region formed by epitaxial deposition of higher resistivity material on the first region and the diffusion of an acceptor element into the epitaxially deposited material, the p-n junction lying in the vicinity of the transition region between the first, lower resistivity n-type region, and the higher resistivity material epitaxially deposited thereon, the concentration of acceptors at the p-n junction being substantially determined by the diffusion of the acceptor element and the concentration of acceptors in the second, p-type region being less than the concentration of donors in the first, lower resistivity n-type region.

The advantage of a device according to the invention, in which the acceptor concentration in the second, p-type region is provided, at least in part by a diffusion step, compared with a device in which a p-type region is epitaxially grown on an n-type region, such that the concentration of acceptors on the p-side of the junction is less than the concentration of donors on the n-side will be apparent from the description of the following preferred embodiments.

Thus in a first preferred form of the invention the second, p-type region is a region of at least partially compensated material formed by the epitaxial deposition of higher resistivity n-type material on the first region and the diffusion of an acceptor element into the epitaxially deposited material. Thus in such a device the desired excess concentration of donors at the n-type side of the p-n junction over the concentration of acceptors at the p-type side is achieved in combination with an at least partially compensated p-type region which according to the last-mentioned publication permits an improved radiation output to be obtained.

In some instances, for example in the manufacture of opto-electronic transistors, it may be required to form the first, lower resistivity n-type region and the second, at least partially compensated p-type region in order of succession. To achieve this by epitaxial techniques alone would involve the deposition of an at least partially compensated p-type region in which both the donor and acceptor concentrations would have to be accurately controlled.

A further advantage is that in the manufacture of the device according to the invention only the donor concentration need be controlled during epitaxial deposition since the acceptor concentration in the second, at least partially compensated p-type region is provided by a diffusion process.

In an important embodiment of the device according to the invention the concentrtaion variation is advantageously chosen to be so that the donor concentration in the first, low resistivity n-type region and/or the donor concentration in the second, at least partially compensated p-type region are substantially uniform. In another important preferred embodiment the acceptor concentration in the second, at least partially compensated p-type region is provided substantially wholly by diffusion and is substantially uniform in this region.

According to a further preferred embodiment the device according to the invention may comprise a first, lower resistivity n-type region having a substantially uniform donor concentration and a second, at least partially compensated p-type region formed by epitaxial deposition of higher resistivity n-type material having a substantially uniform donor concentration on the first region and by the diffusion of an acceptor element into the epitaxially deposited material, the p-n junction lying in the vicinity of the interface between the first, lower resistivity n-type region and the higher resistivity material epitaxially deposited thereon.

In this embodiment the p-n junction may substantially coincide with the interface between the substrate and the epitaxially deposited material. Advantageously, however, the p-n junction is provided in the epitaxially deposited material, the distance between the p-n junction and the interface being at least 0.5 micron, for example, 1 micron.

A further advantage is that, in a device according to the invention in which the at least partially compensated p-type region is formed by epitaxial deposition of higher resistivity n-type material on lower resistivity n-type material with diffusion of an acceptor element in the epitaxially deposited material, the donor concentration may be redistributed so that the p-n junction is eventually located, on diffusion of the acceptor element, a certain distance from the interface in the epitaxially deposited material, the excess concentration of donors in the n-type region side over the concentration of acceptors in the p-type region side being maintained and the degree of compensation being appropriately controlled to give the optimum radiation output. If the at least partially compensated p-type region was formed solely by epitaxial deposition of material containing acceptor and donor elements on the lower resistivity n-type material it would not be possibly to carry out this redistribution of the donor element without affecting the distribution of the acceptor element.

In a second preferred form of the device according to the invention the second, p-type region is a region of substantially uncompensated material formed by the epitaxial deposition of higher resistivity p-type material on the first region and the diffusion of an acceptor element into the epitaxially deposited material. In this device the donor concentration in the first, low resistivity n-type region and/or the total acceptor concentration in the second, p-type region may advantageously be substantially uniform.

In this preferred form the device may advantageously comprise a first, low resistivity n-type region having a substantially uniform donor concentration and a second, substantially uncompensated p-type region formed by epitaxial deposition of higher resistivity p-type material having a substantially uniform acceptor concentration on the first region and the diffusion of an acceptor element into the epitaxially deposited material, the p-n junction lying in the vicinity of the interface between the first, low resistivity n-type region and the higher resistivity material epitaxially deposited thereon.

In this embodiment again the p-n junction is advantageously provided at a given distance, preferably at at least 0.5 micron, from the interface in the epitaxially deposited material. The advantage of a device of the described structure in which the final acceptor concentration in the second region is provided by a diffusion process compared with a device in which the total acceptor concentration is provided during the epitaxial deposition, resides in that in manufacture to locate the p-n junction a certain distance from the interface in the epitaxially deposited material it is necessary to perform some additional heating step to diffuse the donors from the first region into the epitaxially deposited material. To carry out this heating step in a structure in which the total acceptor concentration in the second region has been provided during epitaxial deposition would not be readily possible without affecting redistribution of the concentration of the acceptor element since the acceptor element in the second region will generally have a rapid rate of diffusion compared with the rate of diffusion of the donor element in the first region, and to control the eventual position of the p-n junction under such conditions would be difficult.

According to a further preferred embodiment of the device according to the invention, the semiconductor body is a III–V semiconductor compound, for example, gallium arsenide, or a substituted III–V semiconductor compound, for example, gallium arseno-phosphide ($GaAs_{1-x}P_x$).

In another important form of the invention a donor concentration is used in the first, low resistivity n-type region of at least $10^{18}$ atoms/cm.$^3$.

In again another preferred form of the device according to the invention comprising a second, at least partially compensated p-type region, the donor concentration in this compensated region is at least $10^{16}$ atoms/cm.$^3$.

In an important form of the device, in which the semiconductor body is of gallium arsenide or gallium arseno-phosphide, zinc is used as the acceptor element diffused in the higher resistivity epitaxially deposited material, the concentration of which at the p-n junction preferably is at least $10^{18}$ atoms per cm.$^3$. In such a device in which the second, p-type region is an at least partially compensated region the donor concentration in this region preferably is at least $1\times10^{17}$ atoms/cm.$^3$ or even $9\times10^{17}$ atoms per cm.$^3$.

Another preferred form of the device according to the invention comprises a second, p-type region in material epitaxially deposited in a cavity formed in the material of the first, lower resistivity n-type region.

The epitaxially deposited higher resistivity material in a further preferred form according to the invention may be of a lower energy gap than the material of the first low resistivity n-type region.

The lower energy gap epitaxially deposited material and the higher energy gap material of the first region may be of the same elemental composition, for example, of gallium arseno-phosphide in which the phosphorus concentration is higher in the first region than in the second region. According to an important form the materials have different elemental compositions, for example, the first region consists substantially of gallium arseno-phosphide and the second region consists substantially of gallium arsenide. This construction may be advantageously employed when the p-n junction is the light-emitting junction of a semiconductor lamp, the first, low resistivity n-type region forming a thick substrate, for example of 250 microns thickness, on which a relatively thin, for example, of 5 microns thickness, epitaxial region of material of lower energy gap is deposited, the higher energy gap substrate permitting the emitted light to pass through the substrate without significant absorption. In this device it is desirable that the p-n junction lies spaced from the interface between the gallium arseno-phosphide and the gallium arsenide epitaxially deposited thereon and is located in the epitaxially deposited gallium arsenide. This may be readily effected by epitaxially depositing either p-type or n-type higher resistivity gallium arsenide, according to whether it is desired to have an uncompensated or an at least partially compensated second, p-type region, on lower resistivity n-type gallium arsenide, performing a heating step to diffuse the donor impurity from the gallium arseno-phosphide into the epitaxially deposited gallium arsenide, followed by the diffusion of an acceptor element into the epitaxially deposited gallium arsenide such that the p-n junction is located in the gallium arsenide spaced, for example, by about 1 micron from the interface.

According to the invention, a method of manufacturing a semiconductor device comprising a semiconductor body having a p-n junction which, when suitably biased in the forward direction, produces radiation as a result of recombination of the injected charge carriers is further characterized in that on a first, lower resistivity n-type region, a region of higher resistivity material is epitaxially deposited and an acceptor element is diffused into the epitaxially deposited material to form a second, p-type region, the p-n junction lying in the vicinity of the transition region between the first, lower resistivity n-type region and the higher resistivity material epitaxially deposited thereon, the concentration of acceptors at the p-n junction being substantially determined by the diffusion of the acceptor element and the concentration of acceptors in the second, p-type region being less than the concentration of donors in the first, lower resistivity n-type region.

In a preferred form of the method according to the invention start is made from a first, lower resistivity n-type region having a substantially uniform concentration of donors on which is epitaxially deposited n-type material having a substantially uniform donor concentration, the acceptor element being diffused in the epitaxially deposited material to form an at least substantially compensated p-type region such that the acceptor concentration at the p-n junction in the vicinity of the interface between the first, lower resistivity n-type region and the higher resistivity n-type region epitaxially deposited thereon is substantially determined by the diffusion of the acceptor element.

Advantageously, prior to the diffusion of the acceptor element a heating step may be performed to redistribute the donors in the vicinity of the interface by diffusion from the first, lower resistivity n-type region into the epitaxially deposited material, the diffusion of the acceptor element being subsequently carried out to locate the p-n junction in the epitaxially deposited material and spaced from the interface. In another preferred form of the method according to the invention start is made from a first, lower resistivity n-type region having a substantially uniform donor concentration on which is epitaxially deposited high resistivity p-type material having a substantially uniform acceptor concentration, the diffusion of the acceptor element being consequently carried out such that the acceptor concentration at the p-n junction in the vicinity of the interface between the first, lower resistivity n-type region and the higher resistivity p-type material epitaxially deposited thereon, is substantially determined by the diffusion of the acceptor element.

Also in this form prior to the diffusion of the acceptor element a heating step may advantageously be performed to diffuse the donor element in the first, lower resistivity n-type region into the epitaxially deposited material, the diffusion of the acceptor element being subsequently carried out to locate the p-n junction in the epitaxially deposited material and spaced from the interface.

In an important further form of the method according to the invention, the higher resistivity material is epitaxially deposited in a cavity formed in the material of the first, lower resistivity n-type region.

In another preferred form of the method higher resistivity material is epitaxially deposited which is of lower energy gap than the material of the first, lower resistivity n-type region.

In this case the epitaxially deposited material may have a different elemental composition than the substrate. Advantageously, in this form of the method according to the invention start is made from a first gallium arseno-phosphide region on which higher resistivity gallium arsenide is epitaxially deposited.

Two embodiments of the invention will now be described with reference to the diagrammatic drawings, in which FIGURE 1 is a graph showing the concentration of impurity centres in the semiconductor body of a first embodiment consisting of an opto-electronic transistor;

Figure 1:
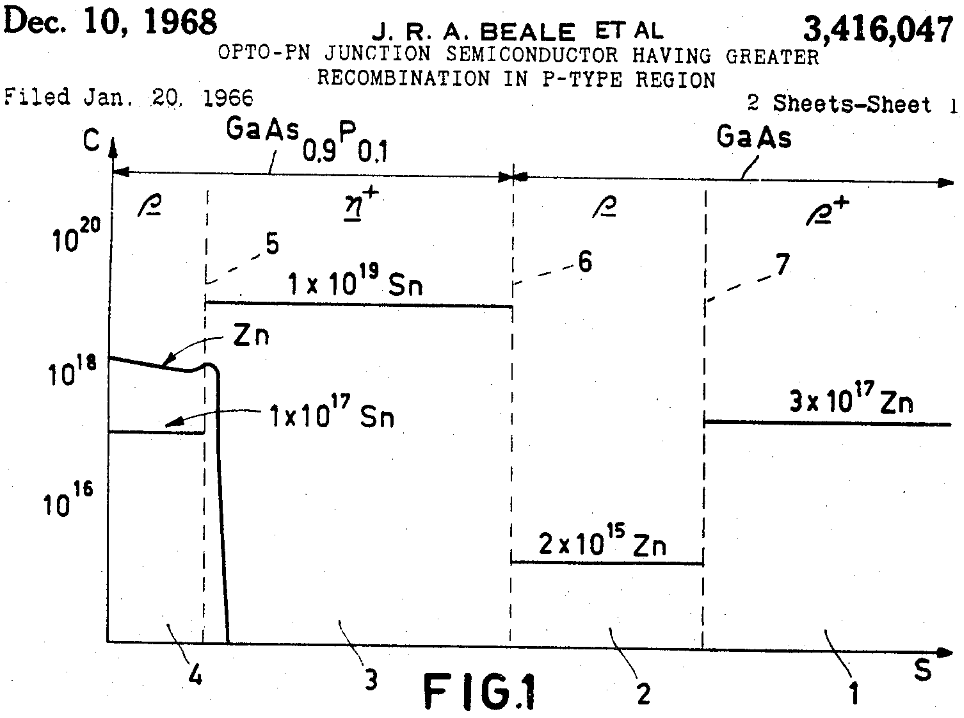
Figure 2:
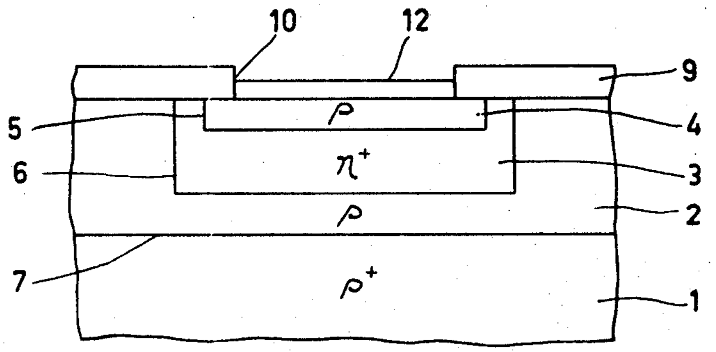
FIGURE 2 is a section through part of the opto-electronic transistor of FIGURE 1 during a stage of manufacture prior to attachment of leads to the various regions of the semiconductor body.
Figure 3:
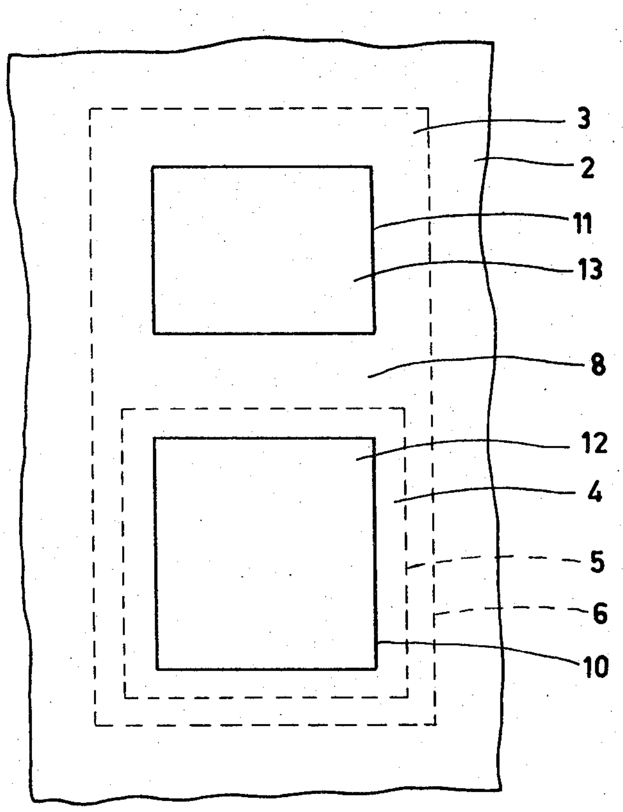
FIGURE 3 is a plan view of the opto-electronic transistor part shown in FIGURE 2.

The opto-electronic transistor of FIGURES 1 to 3, consists of a semiconductor body having a low resistivity $p^+$ substrate 1 of gallium arsenide with a uniform acceptor concentration of zinc of $3\times10^{17}$ atoms/cm.$^3$, a higher resistivity p-type collector region 2 of gallium arsenide epitaxially deposited on the substrate 1 and having a uniform acceptor concentration of zinc of $2\times10^{15}$ atoms per cm.$^3$, a low resistivity $n^+$ base region 3 of gallium arseno-phosphide having a substantially uniform donor concentration of tin of $1\times10^{19}$ atoms/cm.$^3$, a partially compensated p-type emitter region 4 of gallium arseno-phosphide having a uniform donor concentration of tin of $1\times10^{17}$ atoms/cm.$^3$ and an acceptor concentration of zinc, which is at least $1\times10^{18}$ atoms/cm.$^3$ at an emitter-base junction 5, and a collector-base junction 6. The p-n junctions 5 and 6 are represented in FIGURES 1 and 3 by broken lines and the interface between the substrate 1 and the region 2 is represented by a broken line 7 in FIGURE 1.

The emitter and base regions consist of gallium arseno-phosphide of composition $GaAs_{0.9}P_{0.1}$ epitaxially deposited in a cavity 8 (FIGURE 3) formed in the epitaxially deposited gallium arsenide region of higher resistivity in which the collector region 2 is present. They consist of an $n^+$ base region epitaxially deposited in the cavity on the p-type gallium arsenide and a partially compensated p-type emitter region formed by epitaxial deposition of n-type material on the epitaxially deposited $n^+$ type material followed by diffusion of zinc into the surface of the last epitaxially deposited material to yield the p-n junction 5 in the vicinity of the interface between the $n^+$ type material and the n-type material epitaxially deposited thereon. The concentration of the diffused zinc is greater than $1\times10^{18}$ atoms/cm.$^3$ at the surface of the emitter region 4, is substantially uniform in the emitter region and in the vicinity of the junction 5 may rise as shown in FIGURE 1 before decreasing rapidly with depth in the base region 3. The concentration is substantially uniform in the emitter region because in the higher resistivity epitaxially deposited n-type material doped with tin in a concentration of $1\times10^{7}$ atoms/cm.$^3$ the diffusion coefficient is relatively high whereas the initial increase in concentration obtained in the lower resistivity $n^+$ type material of the region is due to the zinc having a higher solubility in this region and the rapid decrease in concentration with increasing depth in the $n^+$ material is due to zinc having a relatively low diffusion coefficient in this material. The tin concentration in the $n^+$ region 3 is shown in FIGURE 1 as being uniform throughout the region but in the vicinity of the junctions 5 and 6 it will be slightly lower due to diffusion into the epitaxially deposited material of the region 4 and diffusion into the gallium arsenide of the collector region 2, which occurs during the subsequent diffusion of zinc into the epitaxially formed material of the region 4.

The emitter-base junction and the collector-base junction both terminate only in the common plane surface of the regions 2, 3 and 4 of the body and the emitter-base junction is surrounded by the collector-base junction within the semiconductor body. The dimensions of the $p^+$ gallium arsenide substrate, are 1 mm. x 1 mm. x .3 mm. thickness, the epitaxially deposited collector region 2 has a thickness of about 30 microns, the collector-base junction 6 is located in the vicinity of the extremity of the cavity 8 formed in the region 2 and has a depth in the region 2 of about 20 microns, and the emitter-base junction is at a depth of 5 microns within the epitaxially deposited gallium arseno-phosphide. The area of the major part of the collector-base junction lying parallel to the interface 7 between the collector region 2 and the substrate 1 and parallel to the common plane surface of the regions 2, 3 and 4 in which both junctions terminate is 110 microns x 60 microns and the corresponding area of the emitter-base junction is 50 microns x 50 microns. The upper common plane surface of the body in which the junctions terminate has an insulating masking layer of silicon oxide 9 deposited thereon with two windows 10 and 11 in the layer 9 in which ohmic contacts 12 and 13 to the emitter and base regions respectively are situated.

The opto-electronic transistor shown in FIGURES 1 to 3 is manufactured as follows:

A body of low resistivity gallium arsenide having zinc as acceptor impurity in a concentration of about $3\times10^{17}$ atoms/cm.$^3$, in the form of a slice 1 cm. x 1 cm. is lapped to a thickness of 0.3 mm. to form a substrate 1 and polished so that it has a substantially damage-free crystal structure and an optically flat finish on one of its larger surfaces. The starting material being a slice of 1 cm.$^2$ will yield a plurality of the described semi-conductor devices by carrying out subsequent steps in the manufacture using suitable masks such that a plurality of isolated devices are formed in the single slice which are later separated by dicing but the method will now be described with reference to the formation of each isolated device, it being assumed that where masking, diffusion, etching and associated steps are referred to then these steps are simultaneously carried out for each isolated device on the single slice prior to dicing.

A layer of p-type gallium arsenide of 30 micron thickness is epitaxially grown by deposition from the vapour phase on the prepared surface of the substrate 1 to form a collector region 2. The gallium arsenide layer is formed at 750° C. by the reaction of gallium and arsenic, the gallium being produced by the disproportionation of gallium monochloride and the arsenic being produced by the reduction of arsenic trichloride with hydrogen. Simultaneously with the formation of the gallium arsenide zinc is deposited such that in the epitaxially grown layer there is a uniform concentration of zinc of $2\times10^{15}$ atoms/cm.$^3$.

A masking layer of silicon oxide is now grown on the surface of the epitaxially deposited gallium arsenide by the reaction of dry oxygen and tetraethyl silicate at a temperature of 350–450° C. The slice is laid horizontally on a pedestal so that no silicon oxide is deposited on the lower surface of the low resistivity substrate.

A photosensitive masking layer, hereinafter termed photoresist, which is used in the photoresist methods commonly used in semiconductor technology is now applied to the surface of silicon oxide layer and exposed through a mask such that an area of 110 microns x 60 microns is shielded from the incident radiation. The unexposed part of the photoresist layer is removed with a developer so that a window 110 microns x 60 microns is formed in the photoresist layer. The underlying oxide layer exposed by the window is now etched with a fluid consisting of a solution of 25% ammonium fluoride and 3% hydrofluoric acid in water. Etching is carried out until a window of 110 microns x 60 microns is formed in the oxide masking layer. The photoresist layer is then removed from the remainder of the surface of the oxide layer by swelling the photoresist with trichloroethylene and rubbing. Suitable photoresist types and developers are known and available commercially.

The body is now etched so that a cavity is formed in the epitaxially deposited gallium arsenide layer 2 at a position corresponding to the window in the oxide layer. Etching is continued until a cavity 8 of 20 microns depth in the epitaxially deposited p-type layer is formed. A suitable etchant is 3 parts concentrated $HNO_3$, 2 parts $H_2O$ and 1 part HF (40%) used at 40° C., the etching rate being approximately 1 micron/sec. The oxide masking layer is subsequently removed by dissolving in the above described solution of ammonium fluoride and hydrofluoric acid in water. The original surface of the epitaxially deposited gallium arsenide layer 2 now having the 20 micron cavity therein is prepared for further epitaxial deposition by etching briefly in the nitric acid and hydrofluoric acid solution described above but used at room temperature.

The prepared body is placed in a tube and a first, low resistivity $n^+$ type layer of gallium arseno-phosphide of composition $GaAs_{0.9}P_{0.1}$ is epitaxially grown on the surface of the previously grown epitaxial layer 2 of gallium arsenide. The gallium arseno-phosphide layer is formed at 750° C. by the reaction of gallium with arsenic and phosphorus. The gallium is produced by the disproportionation of gallium monochloride and the arsenic and phosphorus are produced by the reduction of their trichlorides with hydrogen. Simultaneous with the deposition of the gallium arseno-phosphide tin is deposited such that in the epitaxially grown layer there is a uniform concentration of tin $1 \times 10^{19}$ atoms/cm.$^3$. The epitaxial layer grown follows the contour of the surface and growth is continued until the layer is about 12 microns thick. The conditions of deposition are then modified such that a second, higher resistivity n-type region is grown, by reducing the tin content in the epitaxially deposited material to $1 \times 10^{17}$ atoms/cm.$^3$ This second growth is continued until the epitaxially grown first and second layers of gallium arseno-phosphide fill the cavity and the second grown layer extends over the region of the cavity a few microns beyond the original surface of the epitaxially deposited gallium arsenide layer 2.

After the epitaxial deposition, the body is removed from the tube and a metal disc coated with dental wax is placed in contact with the reverse side of the body. Material is removed from the exposed surface of the body consisting of the epitaxially deposited layer of gallium arseno-phosphide, by polishing until the surface becomes flat and lies a few microns below the original surface of the epitaxially grown layer 2 of gallium arsenide. By the use of suitable staining techniques the original surface of the epitaxially grown layer 2 of gallium arsenide, may be located and the polishing halted thereafter accordingly. By this removal of the gallium arseno-phosphide layer, there remains a body consisting of a $p^+$ substrate having a p-type epitaxial layer 2 of nearly 30 microns thickness with a cavity 8 extending nearly 20 microns from the upper surface into this layer and containing a first, inner layer of low resistivity $n^+$ gallium arseno-phosphide epitaxially grown on the gallium arsenide, of about 12 microns thickness and a second, outer layer of higher resistivity n-type gallium arseno-phosphide, of about 5 microns thickness epitaxially deposited on the $n^+$ layer. The interface 6 between the gallium arseno-phosphide and the gallium arsenide is at the extremity of the cavity 8 and will be the approximate location of the collector-base junction of the opto-electronic transistor.

The surface of the body is given a light cleaning etch in a solution of methanol and bromine, before a masking layer 9 of silicon oxide is grown on the prepared surface of the body by the reaction of dry oxygen and tetraethyl silicate at a temperature of 350–450° C. The body is laid horizontally on a pedestal so that no oxide is deposited on the lower surface.

A photosensitive resist layer is applied to the surface of the silicon oxide masking layer 9 and with the aid of a mask is exposed such that an area situated above the gallium arseno-phosphide epitaxially deposited in the cavity and of dimensions 40 microns x 40 microns is shielded from the incident radiation. The unexposed part of the layer is removed with a developer so that a window of 40 microns x 40 microns is formed in the photoresist layer. The body is then ethed to form a window 10 (FIGURE 3) of 40 microns x 40 microns in the silicon oxide masking layer 9 at a position below the window in the photoresist layer. The etchant is the ammonium fluoride and hydrofluoric acid solution described above for removing the previously formed silicon oxide masking layer.

The photoresist remaining on the surface of the silicon oxide masking layer 9 is removed by swelling in trichloroethylene and rubbing. The body is then placed in a hermetically sealed quartz tube containing zinc and excess arsenic and phosphorus and zinc is diffused into the gallium arseno-phosphide region 3 by heating the tube to 900–1000° C.

The diffusion of zinc is such that the emitter-base junction of the opto-electronic transistor lies at a distance of about 5 microns from the surface and is in the vicinity of the interface between the first epitaxially deposited low resistivity $n^+$ gallium arseno-phosphide layer and the second epitaxially deposited higher resistivity n-type gallium arseno-phosphide layer.

Ohmic contact to the p-type emitte region is made by evaporating gold containing 4% zinc over the entire upper surface of the body. The source is held at 800–1000° C., the body at room temperature and the evaporation is continued for not more than 1 minute, so that a gold 4% zinc contact layer 12 is deposited on the emitter surface in the window 10.

The amount of gold/zinc evaporated over the upper surface is such as to be insufficient to fill the window 10 and the filling is thereafter effected with a protective lacquer, for example, that which is available commercially under the trade name Cerric Resist. The remainder of the gold/zinc on the upper surface of the body is now removed by a solution of 40 g. KI, 10 g. I and 250 g. $H_2O$.

A fresh photoresist layer is applied to the surface and with the aid of a mask exposed such that a second area 40 microns x 30 microns situated above the gallium arseno-phosphide epitaxially deposited in the cavity is shielded from the incident radiation. The unexposed part of the photoresist layer is removed so that a further window 40 microns x 30 microns is formed in the photoresist layer. The body is etched to form a window 11 (FIGURE 3) 40 microns x 30 microns in the silicon oxide masking layer 9 at a position below the window formed in the photoresist layer. The same etchant is used as is used to form the window 10 in the silicon oxide masking layer. The lacquer of Cerric Resist in the window 10 above the evaporated gold/zinc contact is not attacked by the etchant. The window 11 exposes the base region 3 of gallium arseno-phosphide and ohmic contact to this region is made by evaporating gold containing 4% tin over the whole upper surface of the body so that a gold 4% tin contact layer 13 is deposited in the window 11 in the silicon oxide layer. The amount of gold/tin evaporated over the upper surface is such as to be insufficient to fill the window 11 and the filling is thereafter effected with a protective lacquer of Cerric Resist. The remainder of this gold/tin layer on the upper surface of the body is removed with the exposed portion of the photoresist layer by softening this in trichloro-ethylene and rubbing.

The protective lacquer of Cerric Resist in the windows 10 and 11 above the gold/zinc and gold/tin layers respectively is removed by dissolving in acetone.

The body is placed in a furnace and heated to 500° C. for 5 minutes to alloy the gold/zinc and gold/tin contact layers 12 and 13 respectively to the emitter and base region respectively.

A reflective layer of gold (not shown in the figure) may now be selectively applied to the surface of the oxide layer to form a mirror at the periphery of the emitter-base junction. This may be carried out by applying a photoresist layer to the entire surface and with the aid of a mask, exposing the resist layer so that a narrow strip above the periphery of the emitter-base junction is shielded from the incident radiation. The unexposed part of the photoresist layer is removed so that a window corresponding to the narrow strip is formed in the photoresist layer. Gold is then evaporated over the entire upper surface of the body so that in the window formed in the resist layer a reflective gold-layer is deposited on the silicon oxide layer. The evaporated gold on the remainder of the surface is then removed with the exposed portion of the photoresist layer by softening this in trichloroethylene and rubbing.

The slice is now diced up into individual pieces 1 mm. x 1 mm. each comprising an opto-electronic assembly. A molybdenum strip is soldered with a $p^+$ substrate 1 with a bismuth/2% silver alloy or a bismuth/5% cadmium alloy.

Electric leads are then secured to the gold and tin contacts 12 and 13 to the emitter and base regions respectively by thermo-compression bonding gold wires thereto. The assembly together with the current supply wires so attached is then given a final etch in a fluid of 3 parts concentrated $HNO_3$, 2 parts $H_2O$ and 1 part HF (40%) used at room temperature. The assembly is then encapsulated as is desired.

Figure 4:
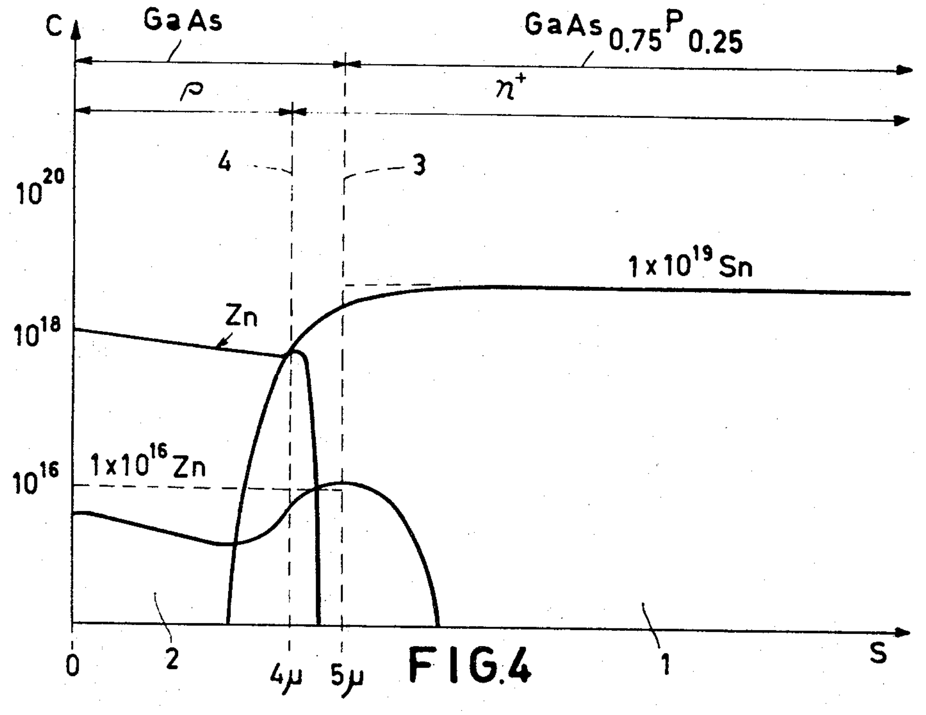
FIGURE 4 is a graph showing the concentration of impurity centres in a semiconductor body of a second embodiment consisting of a semiconductor lamp.

The semiconductor lamp in which the concentration of the impurity centres is shown in FIGURE 4, consists of a semiconductor body of low resistivity $n^+$ gallium arseno-phosphide of 1 mm. x 1 mm. and 250 microns thickness having a cavity of dimensions 20 microns x 20 microns x 5 microns depth in one of its major surfaces filled with gallium arsenide which is epitaxially deposited in the cavity on the gallium arseno-phosphide. FIGURE 4 shows the impurity concentrations C in the body as ordinates in a logarithmic scale and the distance S from the major surface in the body as abscissa. The graph shows a first, low resistivity $n^+$ substrate region of 250 microns overall thickness of gallium arseno-phosphide 1, the region of 5 microns thickness of gallium arsenide 2 epitaxially deposited in a cavity formed in a gallium arseno-phosphide substrate region 1, an interface 3 between the epitaxially deposited gallium arsenide and the gallium arseno-phosphide substrate corresponding to the extremity of the cavity and a p-n junction 4 located in the epitaxially deposited gallium arsenide and spaced about 1 micron from the interface 3.

The $n^+$ gallium arseno-phosphide substrate region 1 is of approximate composition $GaAs_{0.75}P_{0.25}$ and has a substantially uniform donor concentration of tin of $1 \times 10^{19}$ atoms/cm.$^3$. The gallium arsenide epitaxially deposited is higher resistivity p-type material initially having an acceptor concentration of zinc of $1 \times 10^{16}$ atoms/cm.$^3$ which is shown by a dotted line. The epitaxially deposited gallium arsenide contains a further, higher concentration of zinc as shown and obtained by diffusion therein and in the vicinity of the interface also contains the donor tin diffused from the gallium arseno-phosphide substrate region.

The impurity concentration profiles and the eventual location of the p-n junction 4 shown in FIGURE 4 are obtained by the following steps. Subsequent to forming the 5 micron cavity in the $n^+$ gallium arsenophosphide substrate and the epitaxial deposition of higher resistivity p-type gallium arsenide therein by techniques similar to those described in the manufacture of the opto-electronic transistor, a heating step is performed to diffuse tin from the $n^+$ gallium arseno-phosphide into the epitaxially deposited p-type gallium arsenide and to obtain the profile shown in FIGURE 4 in full line. Simultaneously the acceptor zinc initially present in the epitaxially deposited gallium arsenide in a concentration of $1 \times 10^{16}$ atoms/cm.$^3$ will diffuse into the gallium arseno-phosphide substrate to a slight extent. By use of a silicon oxide layer provided on the surface during this diffusion step so that out diffusion of zinc from the surface is restricted an eventual concentration profile of this intial zinc concentration is obtained as shown in full line in FIGURE 4. Moreover since the initial zinc concentration is comparatively low, this diffusion will now significantly effect the doping levels in either the p or $n^+$ material or the position of the p-n junction after the final zinc diffusion. After this heating step and removal of the silicon oxide layer zinc is diffused over the whole major surface, without provision of any mask, to yield a concentration profile as shown with the p-n junction lying in the gallium arsenide spaced about 1 micron from the interface 3. The concentration of zinc and the p-n junction 4 is about $1 \times 10^{18}$ atoms /cm.$^3$. Thus a semiconductor lamp is obtained in which enhanced light output may be obtained due, inter alia, to the substrate region of gallium arseno-phosphide permitting the emitted light to travel through this region without significant absorption. The epitaxially deposited material in which the emitter and p-n junction lie may alternatively consist of epitaxially deposited gallium arseno-phosphide in which the phosphorus concentration is lower than that in the gallium arseno-phosphide substrate region. The epitaxially deposited material may alternatively be n-type material so that a compensated p-type emitter region is eventually obtained after the acceptor diffusion. Such a structure may give a further enhanced light output. The steps outlined to obtain the concentrations shown and the location of the p-n junction in the manufacture of the semiconductor lamp show that the structure of this device according to the invention permits the final acceptor diffusion made to form the emitting p-n junction to be performed without the necessity of making the surface for this diffusion step and this leads to simplicity of manufacture.

What is claimed is:

1. A semiconductor injection recombination radiation source comprising a monocrystalline semiconductive body having a first region of n-type conductivity of relatively low resistivity and including a second epitaxial region of p-type conductivity crystallographically joined to the first region and of relatively higher resistivity than that of said first region, the ratio of the concentration of free charge acceptors in said second region to the concentration of free charge donors in said first region being less than one, said first and second regions forming a p-n junction substantially in said epitaxial material, and means including said junction for producing radiation from recombinaton of injected charge carriers preponderantly in said p-type epitaxial region upon forward bias of said junction.

2. A semiconductor device as claimed in claim 1 wherein the second p-type region is a region of at least partially compensated material containing a substantial concentration of donors which is lower than the concentration of acceptors present.

3. A semiconductor device as claimed in claim 2 wherein the donor concentration in the first lower resistivity n-type region is substantially uniform.

4. A semiconductor device as claimed in claim 3 wherein the donor concentration in the second, at least partially compensated p-type region is substantially uniform.

5. A semiconductor device as claimed in claim 2 wherein the p-n junction is located in the epitaxial material spaced from the interface by at least 0.5 micron.

6. A semiconductor device as claimed in claim 2 wherein the acceptor concentration in the second, at least partially compensated p-type region is formed by diffusion and is substantially uniform.

A semiconductor device as claimed in claim 6 wherein the donor concentration in the first lower resistivity n-type region is at least $10^{18}$ atoms per cm.$^3$.

8. A semiconductor device as claimed in claim 6 wherein the donor concentration in the second at least partially compensated p-type region is at least $1 \times 10^{16}$ atoms/cm.$^3$.

9. A semiconductor device as claimed in claim 6 wherein the acceptor element is zinc and its concentration at the p-n junction is at least $10^{18}$ atoms/cm.$^3$.

10. The invention of claim 1 wherein the concentration of free charge acceptors in said second region is substantially uniform across the second region but falls off rapidly near the p-n junction.

11. A semiconductor device as claimed in claim 1 wherein the semiconductor body is of a III–V semiconductor compound or a substituted III–V semiconductor compound.

12. A semiconductor device as claimed in claim 11 wherein the semiconductod body is of gallium arsenide or of gallium arseno-phosphide.

13. A semiconductor device as claimed in claim 1 wherein the second, p-type region of epitaxial material is located in a cavity formed in the material of the first, lower resistivity n-type region.

14. A semiconductor device claimed in claim 1 wherein the epitaxial higher resistivity material is of lower energy gap than the material of the first, lower resistivity n-type region.

15. A semiconductor device as claimed in claim 14 wherein the first region is of gallium arseno-phosphide and the epitaxially deposited higher resistivity material is gallium arsenide.

References Cited

UNITED STATES PATENTS

| | | | |
|---|---|---|---|
| 3,267,924 | 8/1966 | Duke et al. | 307—88.5 |
| 3,283,160 | 11/1966 | Levitt et al. | 250—213 |
| 3,351,827 | 11/1967 | Newman | 317—235 |

JAMES D. KALLAM, *Primary Examiner.*

U.S. Cl. X.R.

317—237; 313—108; 250—217; 29—569